United States Patent
Savich

(10) Patent No.: US 9,588,161 B2
(45) Date of Patent: Mar. 7, 2017

(54) IONIZATION BALANCE DEVICE WITH SHIELDED CAPACITOR CIRCUIT FOR ION BALANCE MEASUREMENTS AND ADJUSTMENTS

(75) Inventor: Siarhei V. Savich, Sun Plaza (SG)

(73) Assignee: Desco Industries, Inc., Chino, CA (US)

( * ) Notice: Subject to any disclaimer, the term of this patent is extended or adjusted under 35 U.S.C. 154(b) by 186 days.

(21) Appl. No.: 13/991,926

(22) PCT Filed: Nov. 29, 2011

(86) PCT No.: PCT/US2011/062367
§ 371 (c)(1),
(2), (4) Date: Jun. 6, 2013

(87) PCT Pub. No.: WO2012/078403
PCT Pub. Date: Jun. 14, 2012

(65) Prior Publication Data
US 2013/0271164 A1    Oct. 17, 2013

Related U.S. Application Data

(60) Provisional application No. 61/420,629, filed on Dec. 7, 2010.

(51) Int. Cl.
*G01R 27/26* (2006.01)
*H01T 23/00* (2006.01)

(52) U.S. Cl.
CPC ......... *G01R 27/2605* (2013.01); *H01T 23/00* (2013.01)

(58) Field of Classification Search
CPC ......... G01R 27/2605; G01D 5/24; G01L 9/12
See application file for complete search history.

(56) References Cited

U.S. PATENT DOCUMENTS

| 3,908,164 A | 9/1975 | Parker |
| 4,035,720 A * | 7/1977 | Harvey ............... G01R 19/252 315/108 |

(Continued)

FOREIGN PATENT DOCUMENTS

| JP | 2004111310 | 4/2004 |
| WO | WO2013085952 A1 | 6/2013 |

OTHER PUBLICATIONS

PCT International Search Report for PCT/US2011/062367 mailed on Jan. 31, 2012, 4 pages.

(Continued)

*Primary Examiner* — Tung X Nguyen
*Assistant Examiner* — Dominic Hawkins
(74) *Attorney, Agent, or Firm* — Berkeley Law & Technology Group, LLP

(57) ABSTRACT

In one example, this disclosure describes a circuit and techniques that may be used to measure the ion balance in an ionization balance device (10). The described circuit comprises a capacitor (22) that includes two conductors (23, 24), wherein a first one (23) of the conductors is exposed to the output of the ionization device, and the second one (24) of the conductors is shielded from the output of the ionization device. The first conductor may accumulate charge so as to quantify the output of the ionization balance device. A switch (29) may be used to discharge the first conductor at periodic intervals in order to measure the accumulated charge on the first conductor, and signal processing may be performed on this discharge measurement in order to generate feedback that can be used to control and adjust the output of an ion source.

35 Claims, 13 Drawing Sheets

(56) References Cited

U.S. PATENT DOCUMENTS

| | | | |
|---|---|---|---|
| 4,740,862 A | 4/1988 | Halleck | |
| 4,757,422 A * | 7/1988 | Bossard | H01T 23/00 361/231 |
| 4,829,398 A * | 5/1989 | Wilson | A61L 9/22 361/213 |
| 4,872,083 A * | 10/1989 | Blitshteyn | H01T 23/00 250/324 |
| 5,008,594 A * | 4/1991 | Swanson | H05F 3/04 250/423 R |
| 5,422,573 A * | 6/1995 | Bills | H01J 41/04 250/374 |
| 6,075,366 A | 6/2000 | Yasuda | |
| 6,252,756 B1 | 6/2001 | Richie, Jr. et al. | |
| 6,433,552 B1 | 8/2002 | Williams | |
| 6,717,414 B1 | 4/2004 | Rodrigo et al. | |
| 6,850,403 B1 | 2/2005 | Gefter et al. | |
| 6,985,346 B2 | 1/2006 | Kraz et al. | |
| 7,382,140 B2 | 6/2008 | Obrecht | |
| 7,427,864 B2 | 9/2008 | Williams et al. | |
| 7,456,634 B2 * | 11/2008 | Knott | H01J 41/04 313/240 |
| 7,522,402 B2 | 4/2009 | Kraz et al. | |
| 7,586,731 B2 | 9/2009 | Sato et al. | |
| 7,612,981 B2 | 11/2009 | Seto et al. | |
| 7,649,728 B2 | 1/2010 | Fujita et al. | |
| 7,729,101 B2 | 6/2010 | Gefter | |
| 7,768,267 B2 * | 8/2010 | Knott | G01L 21/34 250/397 |
| 8,324,905 B2 * | 12/2012 | Barrett | F02P 17/12 324/380 |
| 8,648,604 B2 * | 2/2014 | Brucker | G01L 21/32 250/389 |
| 8,686,733 B2 * | 4/2014 | Brucker | G01L 21/34 250/283 |
| 2001/0028066 A1 * | 10/2001 | Shinohara | H04N 5/3575 257/114 |
| 2003/0218855 A1 * | 11/2003 | Goldenberg | H01T 23/00 361/213 |
| 2004/0145852 A1 * | 7/2004 | Kraz | H01T 23/00 361/225 |
| 2004/0207411 A1 | 10/2004 | Kawata | |
| 2005/0050948 A1 * | 3/2005 | Zhu | F02P 17/12 73/114.69 |
| 2007/0159205 A1 | 7/2007 | Grund | |
| 2008/0030918 A1 | 2/2008 | Nakajima | |
| 2008/0053818 A1 * | 3/2008 | Ui | H01J 37/32091 204/164 |
| 2009/0115345 A1 * | 5/2009 | Steffie | H02M 1/32 315/291 |
| 2009/0135538 A1 * | 5/2009 | Yasuoka | H01T 23/00 361/213 |
| 2010/0154994 A1 * | 6/2010 | Fischer | H01J 37/32623 156/345.24 |
| 2012/0043972 A1 * | 2/2012 | Jayaraman | G01R 27/2605 324/658 |
| 2013/0088238 A1 | 4/2013 | Julicher | |
| 2013/0154670 A1 | 6/2013 | Cooke | |
| 2013/0271164 A1 | 10/2013 | Savich | |
| 2014/0333331 A1 | 11/2014 | Savich | |

OTHER PUBLICATIONS

SIPO, "First Office Action", mailed May 8, 2014, CN Application No. 201180058849.9, 13 pgs.

International Preliminary Report on Patentability, mailed Jun. 12, 2013, Appl No. PCT/US2011/062367, filed Nov. 29, 2011, 1 pg.

JPO, Office Action, mailed Jun. 2, 2015, JP Appl No. 2013-543206, 7 pgs.

Response to 1st Office Action, CN Appl No. 201180058849.9, 7 pgs.

Crowley et al. "Equivalent circuits for air ionizers used in static control", Journal of Electrostatics, vol. 61, Issue 2, Jun. 2004, pp. 71-83.

International Search Report, PCT/US2012/067869, ISA/EPO, mailed Mar. 22, 2013, 3 pages.

International Preliminary Report on Patentability, PCT/US2012/067869, WIPO, mailed Jun. 10, 2014, 5 pages.

Office Action, U.S. Appl. No. 14/360,705, mailed Dec. 4, 2015, 12 pages.

* cited by examiner

IONIZATION BALANCE DEVICE WITH SHIELDED CAPACITOR CIRCUIT FOR ION BALANCE MEASUREMENTS AND ADJUSTMENTS

TECHNICAL FIELD

This disclosure relates to ionization balance devices and, more particularly, to circuits used to measure the ion balance in the ionized output of ionization balance devices in order to provide feedback to control the output.

BACKGROUND

Ionization balance devices refer to devices that generate positive ions and negative ions for delivery to a target area. Ionization balance devices are commonly used in a wide variety of industries in order to remove or minimize static charge accumulation in a work area. Ionization balance devices are also commonly referred to as static charge neutralizers.

One specific type of ionization balance device is commonly called an ionizing blower. An ionizing blower typically includes an ion source that generates positive ions and negative ions using the so-called "corona method." An ionizing blower uses a fan (or fans) to direct the ions toward a target area of interest.

With the corona method, a high voltage (e.g., 5-20 kV) is applied to a set of sharp points (often needle-like structures), and an intense electric field is established near these sharp points. The field accelerates free electrons to a sufficiently high energy in order to allow the free electrons to collide with molecules so as to ionize the molecules. When the voltage on one of the points is positive, positive ions are repelled into the environment and when the voltage on one of the points is negative, negative ions are repelled into the environment. The blower can deliver the ionized air (including the positive ions and negative ions) towards a target area. Corona ionizers may be designed to work with AC voltage or DC voltage, and the use of AC or DC voltage may provide different benefits. Other types of ion sources also exist and may be used in ionization balance devices. For example, ion sources may also use ionizing radiation to generate ions via the so-called alpha ionizer method.

With ionization balance devices, it can be very important to monitor and control the ion output of the devices. Such monitoring and control may address ion balance and ion air current. Ion balance generally occurs when the number of positive ions equals the number of negative ions delivered from the ionization device. The ion air current may include the number of ions delivered per unit area to a target area, and may be affected by the type and quality of the ion source as well as the strength of the fan (or fans) that deliver the ionized air from the ionization balance devices.

SUMMARY

This disclosure describes a circuit and techniques that may be used to measure the ion balance in an ionization balance device. The described circuit comprises a capacitor (i.e., a first capacitor) that includes two conductors, wherein a first one of the conductors is exposed to the output of the ionization device, and the second one of the conductors is shielded from the output of the ionization device. The first conductor may accumulate charge so as to quantify the output of the ionization balance device. A switch may be used to discharge the first conductor at periodic intervals in order to measure the accumulated charged on the first conductor, and signal processing may be performed on this discharge measurement in order to generate feedback that can be used to control and adjust the output of an ion source. The circuit may also include another capacitor (i.e., a second capacitor) that shares an end terminal with the first capacitor, and the second capacitor may also use the second conductor of the first capacitor as one of its conductors. The circuit may also include a resistor positioned in parallel with the second capacitor, and the resistor may have a substantially reduced resistance relative to similar types of resistors of conventional ion balance measurement circuits.

In one example, this disclosure describes an ionization balance device comprising an ion source that emits ions, and a capacitor including a first conductor and a second conductor. The first conductor is exposed to the ions emitted by the ion source, and the second conductor is shielded from the ions emitted by the ion source.

In another example, this disclosure describes a circuit configured to measure ion balance of an ion source. The circuit comprises a first capacitor including a first conductor and a second conductor, wherein the first conductor is exposed to ions emitted by the ion source, and the second conductor is shielded from the ions emitted by the ion source. The circuit also comprises a second capacitor that includes the second conductor of the first capacitor and a third conductor. The circuit also comprises a resistor positioned in parallel with the second capacitor where the parallel combination of the resistor and the second capacitor is in series with the first capacitor, and a switch, wherein the first conductor accumulates emitted ions from the ion source when the switch is open and the first capacitor discharges accumulated charge when the switch is closed.

In another example, this disclosure describes a circuit configured to measure ion balance of an ion source. The circuit comprises a first capacitor including a first conductor and a second conductor, and a second capacitor that shares an end terminal with the first capacitor, wherein the second capacitor includes the second conductor of the first capacitor and a third conductor. The circuit also comprises a resistor positioned in parallel with the second capacitor where the parallel combination of the resistor and the second capacitor is in series with the first capacitor, wherein the resistor defines a resistance less than approximately 10 megaOhm.

In another example, this disclosure describes a device comprising an ion source that emits ions, and a circuit configured to receive the emitted ions from the ion source and output a signal indicative of ion balance of the ion source, wherein the signal is substantially insensitive to any external electromagnetic fields that are not generated by the emitted ions.

The details of one or more examples of this disclosure are set forth in the accompanying drawings and the description below. Other features, objects, and advantages associated with the examples will be apparent from the description and drawings, and from the claims.

DETAILED DESCRIPTION

This disclosure describes a circuit and techniques that may be used to measure and control the ion balance in an ionization balance device. The described circuit comprises a capacitor (i.e., a first capacitor) that includes two conductors, wherein a first one of the conductors is exposed to the output of the ionization device, and the second one of the conductors is shielded from the output of the ionization device. The first conductor may accumulate charge so as to quantify the output of the ionization balance device. A switch may be used to discharge the first conductor at periodic intervals in order to measure the accumulated charged on the first conductor, and signal processing may be performed on this discharge measurement in order to generate feedback that can be used to control and adjust the output of an ion source. The circuit may also include another capacitor (i.e., a second capacitor) that shares an end terminal with the first capacitor, and the second capacitor may also use the second conductor of the first capacitor as one of its conductors. The circuit may also include a resistor positioned in parallel with the second capacitor, and the resistor may have a substantially reduced resistance relative to similar types of resistors of conventional ion balance measurement circuits.

Figure 1:
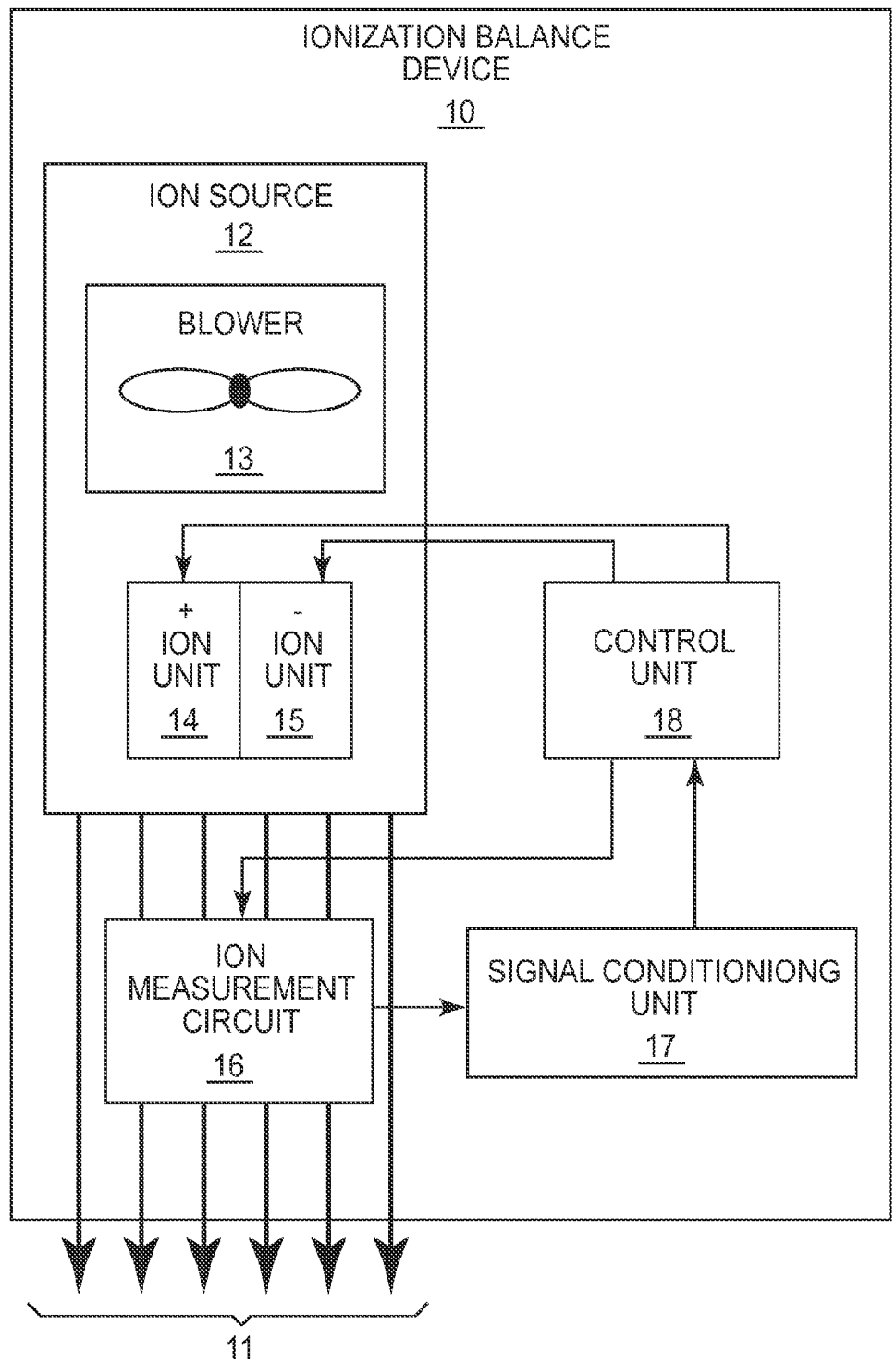
FIG. 1 is a block diagram of an exemplary ionization balancing device consistent with this disclosure.

FIG. 1 is a block diagram of an exemplary ionization balancing device 10 consistent with this disclosure. As shown in FIG. 1, ionization balancing device 10 includes an ion source 12 that emits ions from ionization balancing device 10. The emitted ions 11 may remove or minimize static charge accumulation in a targeted area, such as a work area associated with the manufacturing or assembly of electronics. Ionization balancing device 10 may be used in a wide variety of settings or environments to remove or minimize static charge accumulation.

Ion source 12 may include various elements or units that generate ions 11. As one example, ion source 12 may include a positive ion unit 14, a negative ion unit 15, and a blower 13. Blower 13 may comprise one or more fans that blow air past positive ion unit 14 and negative ion unit 15. In this example, ionization balancing device 10 may be referred to as an ionizing blower that directs ions toward a target area of interest.

Ion units 14 and 15 may generate ions according to the so-called corona method. According to the corona method, a high voltage (e.g., 5-20 kV) is applied to a set of sharp points (often needle-like structures), and an intense electric field is established near these sharp points. The field accelerates free electrons to a sufficiently high energy in order to allow them to ionize molecules with which the free electrons collide. Positive ion unit 14 may deliver a high positive voltage potential to needle-like structures in order to generate positive ions, and negative ion unit 15 may deliver a high negative voltage potential to needle-like structures in order to generate negative ions. The ions 11 are repelled into the environment via blower 13 so as to deliver direct ionized air (including the positive ions and negative ions) towards a target area. Ion source 12 could alternatively use ionizing radiation (e.g., using the so-called alpha ionizer method) or other techniques in order to generate ions.

The ions 11 that are emitted from ionization balancing device 10 may be first exposed to ion measurement circuit 16. Ion measuring circuit 16 may be configured to determine the ion balance in the emitted ions 11, and may generate signals that indicate any excess positive charge or excess negative charge associated with the emitted ions. Signal conditioning unit 17 may include one or more amplifiers, peak and hold units (e.g., integrators), low pass filters, or other units or elements in order to properly condition the output signals from ion measurement circuit 16. The output of signal conditioning unit 17 may be delivered to control unit 18, which may comprise a microprocessor or controller used to control the input signals to ion units 14, 15. Control unit 18 may also control operation of ion measurement circuit 16, such as by controlling a periodic on-off switching of ion measurement circuit 16, as explained in greater detail below. When ion measurement circuit 16 detects excess positive charge, control unit 18 may cause negative ion unit 15 to generate more negative ions and/or cause positive ion unit 14 to generate fewer positive ions. Similarly, when ion measurement circuit 16 detects excess negative charge, control unit 18 may cause negative ion unit 15 to generate fewer negative ions and/or cause positive ion unit 14 to generate more positive ions. In this way, ion measurement circuit 16, signal conditioning unit 17, control unit 18 and ion units 14, 15 may form a closed-loop feedback system for measuring and controlling the ion balance in the emitted ions 11 that are output from ionization balancing device 10.

Signal conditioning unit 17 may be coupled to ion measurement circuit 16 and may be configured to output a signal indicative of ion balance. In particular, signal conditioning unit 17 may be configured to generate a first signal proportional to a positive charge that accumulates on a capacitor of ion measurement circuit 16, and to generate a second signal proportional to a negative charge on the capacitor. The signal conditioning unit 17 may be further configured to generate a difference between the first signal and the second signal, wherein the difference comprises a measure of ion balance. Control unit 18 may receive the measure of ion balance and generate control signals for ion source 12 in order to change the ion balance.

As described in greater detail below, ion measurement circuit 16 may comprise a capacitor that includes a first conductor and a second conductor. The first conductor may be exposed to the ions 11 emitted by ion source 12, the second conductor may be shielded from ions 11 emitted by the ion source 12. As one example, the capacitor (not shown in FIG. 1) may comprise a cylindrical capacitor in which an outer conductor is separated from an inner conductor wire by a dielectric. In this case, the outer conductor can be exposed to the ions 11 emitted by the ion source 12, while the inner conductor may be shielded from the ions 11 emitted by the ion source 12 by, for example, the outer conductor. However, the capacitor may assume many other forms, as long as one of the conductors is exposed to ions 11 and the other conductor is shielded from ions 11.

Ion measurement circuit 16 may further include a switch, as described in greater detail below. The first conductor accumulates the emitted ions when the switch is open and the capacitor discharges accumulated charge when the switch is closed. The switch can be opened and closed at periodic intervals to generate signals indicative of ion balance. In this case, the capacitor described in greater detail below can output a pulse when the switch is closed, wherein the pulse defines a magnitude that is proportional to excess charge accumulated on the first conductor, and a direction that defines whether the excess charge is positive charge or negative charge.

Some examples of ionization balance control may use an antenna type sensor in the form of metallic grid or plane, connected through the high value resistor to a ground voltage. In this case, the positive and negative ion streams from the ion source may collide with the antenna type sensor and create two opposite currents via the resistor. In this case, the voltage on the resistor may be proportional to the difference between positive and negative ion quantities and equal to zero in the case when ionization device is balanced, which means that the device outputs approximately the same amounts of positive and negative ions per time unit. The voltage on the resistor could be used as the control signal in a negative feedback system for ionizer balancing.

However, the antenna type sensor approach with a large value resistor may have significant disadvantages. One disadvantage is that the system can be impacted by static voltage. Accordingly, this approach may require attempts to separate ionization and static voltage, which can be difficult. For example, to separate ionization and static voltage techniques may require determinations of the difference in spectra of the component induced by the ion flow and the component caused by external static electric field in the sensor output signal. It may be assumed that ionizer balance drift is very slow and all fast voltage changes should be rejected. However, this method has limitations and does not work when a charged object is moving slowly towards the antenna because, in this case, drift caused by the static field change may appear similar to the informational component induced by the flow of ions.

Another disadvantage of the antenna type sensor approach is that the external electromagnetic fields (both static and non-static) may charge an input sensor capacitor and saturate the measurement circuits. If antenna impedance is very high, a long time is required for the input capacitor to discharge, and during this time the sensor may incorrectly provide an output signal corresponding to a significant ion imbalance. Furthermore, in this case, simply touching the antenna could cause the controller to malfunction for a long time until the input capacitor discharges.

In addition, antenna-based sensors typically have very high impedance, which may require a front end measuring circuit with very low input current and low board leakages. The leakages may be eliminated by an initial circuit balance, but may have temperature and time drifts, which creates an additional system error and can require periodic controller testing and balancing.

Another solution may be to protect the sensor from the static voltage and external electromagnetic fields. In this case the part of ionized air may be delivered to a shielded measuring channel, which is protected by the external fields. This approach, however, may require a more complex mechanical design. It may be particularly difficult to realize this approach for compressed air ionizers, or so-called "bar ionizers" because, in this case, a low pressure area, relative to surrounding room, may not exist.

Sometimes it can be desirable to control the ion balance on a large surface or inside some closed space (such as a chamber or an entire clean room) in order to be sure that ionization device does not emit extra negative or positive ions, which could create static charge. Antenna-based approaches are not well suited to this type of service because the control area is limited by the size of the antenna. Accordingly, antenna-based approaches may only be able to measure or control ion balance at the point of placement. Increasing the antenna size may reinforce the impact of the external electromagnetic fields and leakages.

The ion measurement circuit described herein may provide solutions that address these problems with antenna-based ion balance approaches. The ion measurement circuit described herein may be sufficiently protected from external electromagnetic fields, may have relatively low impedance, and may be capable of working in a large area, such as a clean room. The control signal (e.g., the feedback signal) used for ion balancing may be based only on a ratio of positive ions and negative ions, and may not depend from the other factors.

The techniques of this disclosure are based on a sensor (i.e., the ion measurement circuit), which may take the form of a cylindrical capacitor (or the like) with an uncovered external plate (cylinder) used as ion receiver. Other configurations are also possible, as long as one of the conductors of the capacitor is shielded. With the cylindrical example, the internal plate of the capacitor may comprise a wire or probe connected through a relatively small value resistor to a ground plane. The probe can be placed into the closed metallic surface, yet shielded from external fields. The uncovered cylinder plate of the capacitor accumulates the charge from emitted ions, and a switch may be used to periodically discharge the capacitor through a resistor. The amplitude of the voltage spike across the resistor may be directly proportional to the ionizer imbalance, and may depend only from the capacitor charge and not from any external electromagnetic fields.

A signal can be obtained after relatively simple signal conditioning may be used for a precise corrective adjustment of high voltage positive and negative power supplies for a DC type ionization device, or for precise corrective adjustment of a pulse duty circle for a pulse type ionization device. The techniques may also work well with AC-type ionization devices. In this case, if extra charge on the plate is created, the extra charge may be used for the AC ionization device monitoring.

The capacitor used for collective ionized charge, as described herein may be implemented in a wide variety of mechanical shapes, such as a cylindrical ring for a fan blower ionization device or via a cylindrical wire for a compressed air bar ionization device. The capacitor could also be a rectangular capacitor, an oval capacitor, or any capacitor with an outer conductor that shields an inner conductor. Furthermore, other configurations would also work as long as the one conductor of the capacitor is properly shielded and another conductor of the capacitor is exposed to the emitted ions. The circuit may also be used in combination with several ionization generators so as to measure the average balance for a larger whole ionization system (such as within a clean room), which may provide the advantage to support relatively large zero ion balance work area.

Figure 2:
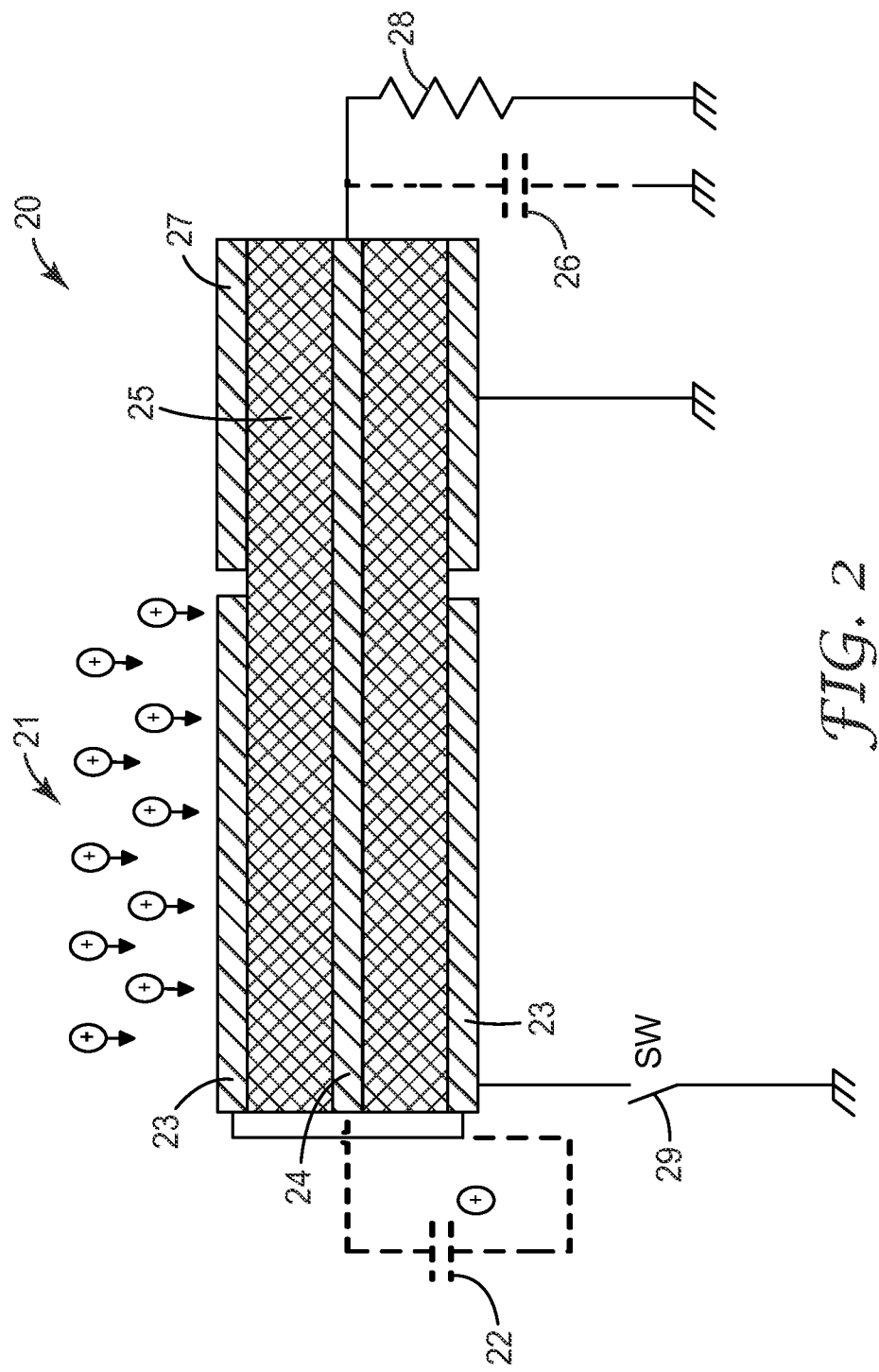
FIG. 2 is a conceptual side view and circuit diagram illustrating one example of an ion measurement circuit consistent with this disclosure.

FIG. 2 is a conceptual side view and circuit diagram illustrating one example of an ion measurement circuit 20, which may correspond to ion measurement circuit 16 of FIG. 1. In the example of FIG. 2, ion measurement circuit 20 may be configured to measure ion balance of an ion source that emits ions 21. Circuit 20 may comprise a first capacitor (conceptually illustrated as capacitor 22). Capacitor 22 includes a first conductor 23 and a second conductor 24, wherein first conductor 23 is exposed to ions 21 emitted by the ion source, and second conductor 24 is shielded from ions 21 emitted by the ion source. A dielectric material 25 may separate first conductor 23 from second conductor 24.

Circuit 20 may comprise a second capacitor (conceptually illustrated as capacitor 26). Second capacitor 26 shares an end terminal with first capacitor 22. Second capacitor 26 includes second conductor 24 of first capacitor 22, and also includes a third conductor 27. Although conductors 27 and 24 are illustrated in a unitary structure with conductors 23 and 24, this is not necessary. Alternatively, for example, conductor 27 may be formed on a printed circuit board (or as a discrete unit) and conductor 24 may comprise a wire that is shielded by conductor 23 for capacitor 22, but shielded by a housing (e.g. for housing the printed circuit board) for capacitor 26.

Circuit 20 may also comprise a resistor 28 that shares an end terminal with first capacitor 22 and is positioned in parallel with second capacitor 26 where the parallel combination of resistor 28 and second capacitor 26 is in series with first capacitor 22. Relative to discharge resistors in antenna-based sensor designs, resistor 28 may have a low resistance (e.g., less than 10 megaOhm, such as less than 1 megaOhm, or less than 100 kiloOhm), which is desirable to as to ensure that currents generated by a voltage drop across resistor 28 are large enough to allow for relatively simple signal conditioning. Circuit 20 may also include a switch 29 coupled to first conductor 23. The first conductor 23 accumulates emitted ions 21 from the ion source when switch 29 is open and first capacitor 22 discharges accumulated charge when the switch is closed, causing a voltage drop across resistor 28. As illustrated, switch 29, third conductor 27, capacitor 26 and resistor 28 are all coupled to a ground potential, which may be a common grounded element used to ground all of these components.

In one example, first conductor 23 may comprise an uncovered metallic cylinder exposed to a stream of emitted ions 21 from a fan blower. In this example, the uncovered metallic cylinder is connected to a ground plane through switch 29. Second conductor 24 may comprise a metallic probe that is positioned inside the uncovered metallic cylinder. A dielectric material 25 may separate first conductor 23 from second conductor 24. In this way, first conductor 23, second conductor 24 and dielectric material 25 may form a cylindrical capacitor, although this disclosure is not necessarily limited to any cylindrical configuration for capacitor 22.

Second conductor 24 may be placed into proximity with a third conductor 27, which may be grounded, so as to form second capacitor 26. Second conductor 24 may then be coupled to ground through resistor 28. The resistance of resistor 28 may be less than 10 megaOhm, and may have a value of between 100 kiloOhm and 10 megaOhm. Resistor 28 may comprise a resistor circuit or possibly a transistor circuit or another circuit that achieves the desired resistance. Second capacitor 26 is formed by first conductor 23 and third conductor 27. Second capacitor 26 may be used for a connection to a signal conditioning circuit (such as unit 17 of FIG. 1).

Figure 3:
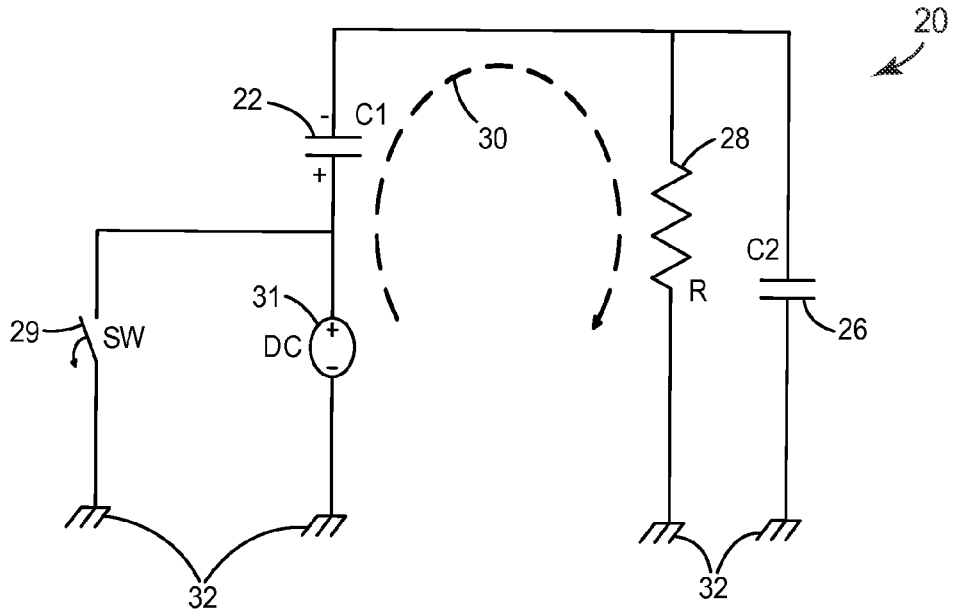
FIG. 3 is a circuit diagram corresponding to an ion measurement circuit with a switch in an open position.
Figure 4:
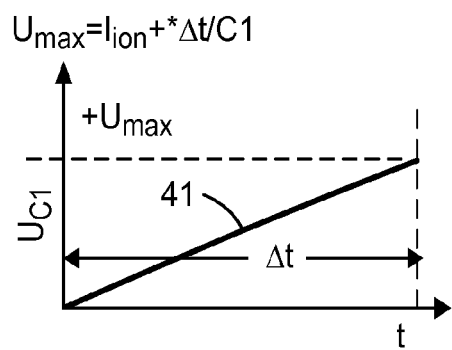
FIG. 4 is a graph illustrating the accumulation of voltage on a capacitor, consistent with this disclosure, as a function of time.
Figure 5:
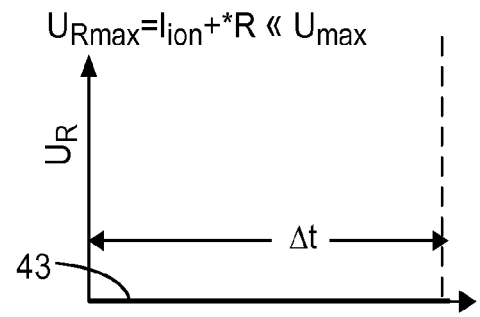
FIG. 5 is a graph illustrating the voltage across a resistor as a function of time.
Figure 6:
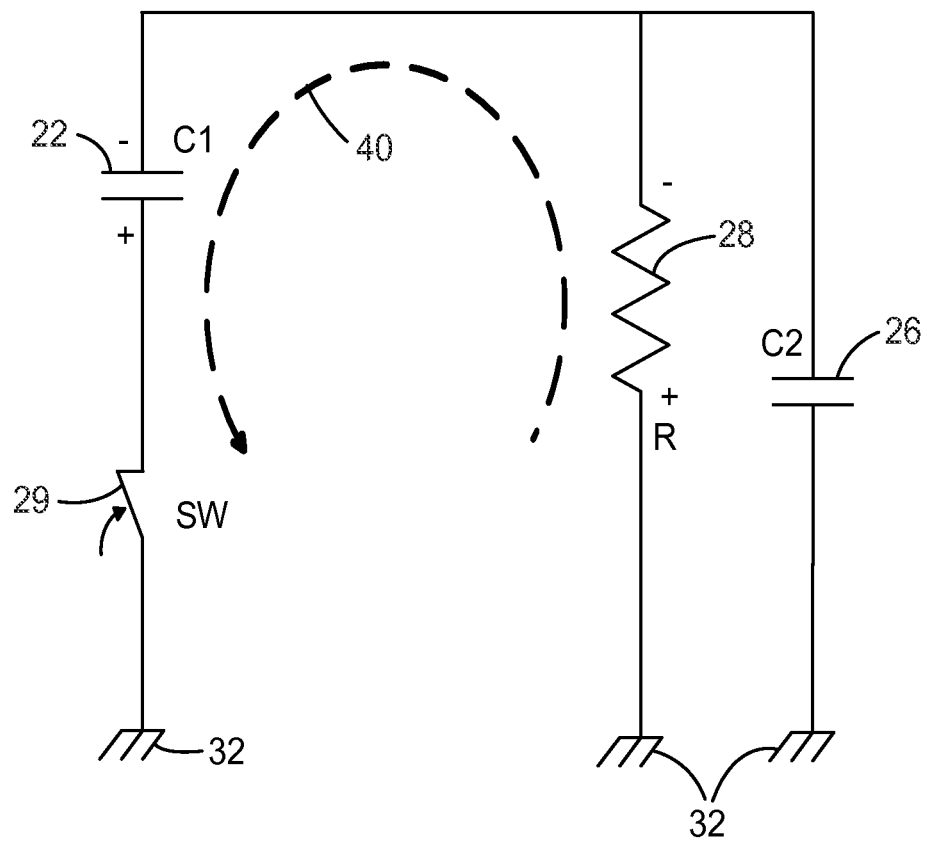
FIG. 6 is a circuit diagram corresponding to an ion measurement circuit with a switch in a closed position.

A situation where ion measurement circuit 20 measures a positive ion imbalance (e.g., more positive ions than negative ions) will be considered, which is why FIG. 2 shows positive ions at element 21. FIG. 3 and FIG. 6 are circuit diagrams corresponding to ion measurement circuit 20 with switch 29 open (FIG. 3) and switch 29 closed (FIG. 6). FIG. 3 illustrates a scenario when an ion imbalance current 30 is charging the first capacitor 22 by exposure of first conductor 23 to ions 21. In FIG. 3, switch 29 (which is typically an electrical switch implemented via one or more transistors) is open and the unbalanced nature of the emitted ions is represented as a DC voltage source 31 with an infinitely large internal impedance so the current in the connected circuit does not depend from any load value. In such a way, emitted ions can charge first capacitor 22 by a constant ion imbalance causing current 30 to flow through circuit 20. The voltage that accumulates on first capacitor 22 may be represented by the formula:

$$U(\Delta t) = I_{ion+} * \Delta t / C1 \qquad \text{Equation (1)}$$

where $I_{ion+}$ is an equivalent ion stream current, $\Delta t$ is a charging time period when the switch 29 is open and C1 is the capacitance value of first capacitor 22. FIG. 4 shows equation 1 and graphically illustrates the accumulation of voltage ($U_{C1}$) as a function of time (t) according to line 41 consistent with equation 1. FIG. 5 includes an equation showing the corresponding voltage ($U_R$) across resistor 28 as a function of resistance R for resistor 28. The ground voltage is labeled as element 32 in FIGS. 3 and 6.

Ion imbalance current $I_{ion+}$ (shown as element 30 in FIG. 3) may be proportional to the number of extra positive ions produced by the ion source per unit time. The voltage across resistor 28 that is created by this current may be much smaller than the obtained charge voltage on capacitor 22 and can be excluded from the consideration. For example, an imbalance current of 1 nano ampere in a 20 milliseconds time interval may charge the capacitor to 200 picoFarads pF for 0.1 Volts and may create a constant offset voltage of just 0.1 millivolts on resistor 28 when resistor has a resistance value of 100 kiloohm. FIGS. 4 and 5 can be viewed as comparative graphs of voltage changes on capacitor 22 (see line 41 of FIG. 4) and resistor 28 (see line 43 of FIG. 5).

FIG. 6 is a circuit diagram of ion measurement circuit 20 when switch 29 is closed. In this case, capacitor 22 may have been previously charged by the ion imbalance current 30. When switch 29 is closed, capacitor 22 discharges through switch 29 and resistor 28. The discharge current 40 is shown as the dotted circled arrow in FIG. 6. Discharge current 40 creates a negative voltage spike across resistor 28 relative to the ground voltage. The maximum amplitude of this spike may be calculated as:

$$U_{Rmax} = -I_{ion+} * \Delta t / (C1 + C2) \qquad \text{Equation (2)}$$

Figure 7:
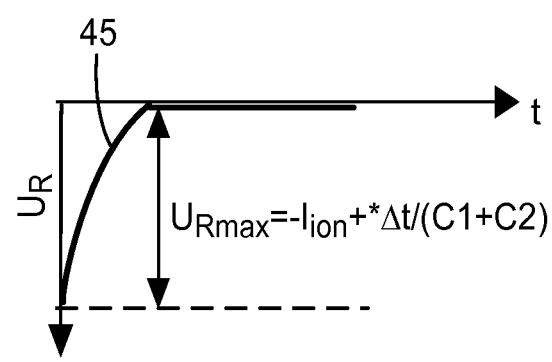
FIG. 7 is a graph illustrating a voltage spike across a resistor as a function of time.

FIG. 7 shows equation 2 and graphically illustrates voltage spike across resistor 28 as a function of time (see element 45). After the voltage spike, the absolute voltage may exponentially fall down to zero with the time constant:

$$\tau = R * (C1 + C2) \qquad \text{Equation (3)}$$

where R is the resistance of resistor 28, C1 is the capacitance of capacitor 22 and C2 the capacitance of capacitor 26 (all in SI units according to the International System of Units).

The time constant ($\tau$) may be significantly smaller than the charge interval for capacitor 22. In an illustrative and non-limiting example, the charge interval may be on the order of approximately 16 milliseconds, in which case the time constant ($\tau$) may be significantly smaller than 16 milliseconds. The value used for the resistance of resistor 28 may ultimately affect the desired charge interval and the time constant ($\tau$).

The voltage spike amplitude may be smaller than the initial charge voltage accumulated on capacitor 22 by exposure to emitted ions because once switch 29 is closed the total charge of the capacitor 22 may momentary redistribute between both capacitors 22 and 28. As can be seen from the equation (2) the maximum amplitude of the voltage spike on the resistor 28 may be in direct proportion to the ionizer equivalent imbalance current $I_{ion+}$ (shown as element 30 in FIG. 3).

For monitoring and control of the ion balance, capacitor 22 is constantly charged by the ionizer imbalance current 30 (via exposure of first conductor 23), and periodically discharged through resistor 28 and switch 29 in such a way creates the sequence of pulses with the amplitudes of the pulses being proportional to the ion imbalance output by the ion source. Switch 29 is opened and closed (electronically) to create this periodic cycle of charging capacitor 22 and discharging capacitor 22. The polarity of the pulses may be negative when the ion source is producing extra positive charge and the polarity of the pulses may be positive when the ion source is producing extra negative charge. The amplitude of the pulses may be independent of any external static voltage or electromagnetic field because the second conductor 24 is shielded, such as by a closed metallic surface of first conductor 23. Furthermore, even in the case where first conductor 23 is touched by a user (or otherwise grounded unintentionally), this will simply cause one discharge and only one pulse from a sequence of pulses will be affected.

Figure 8:
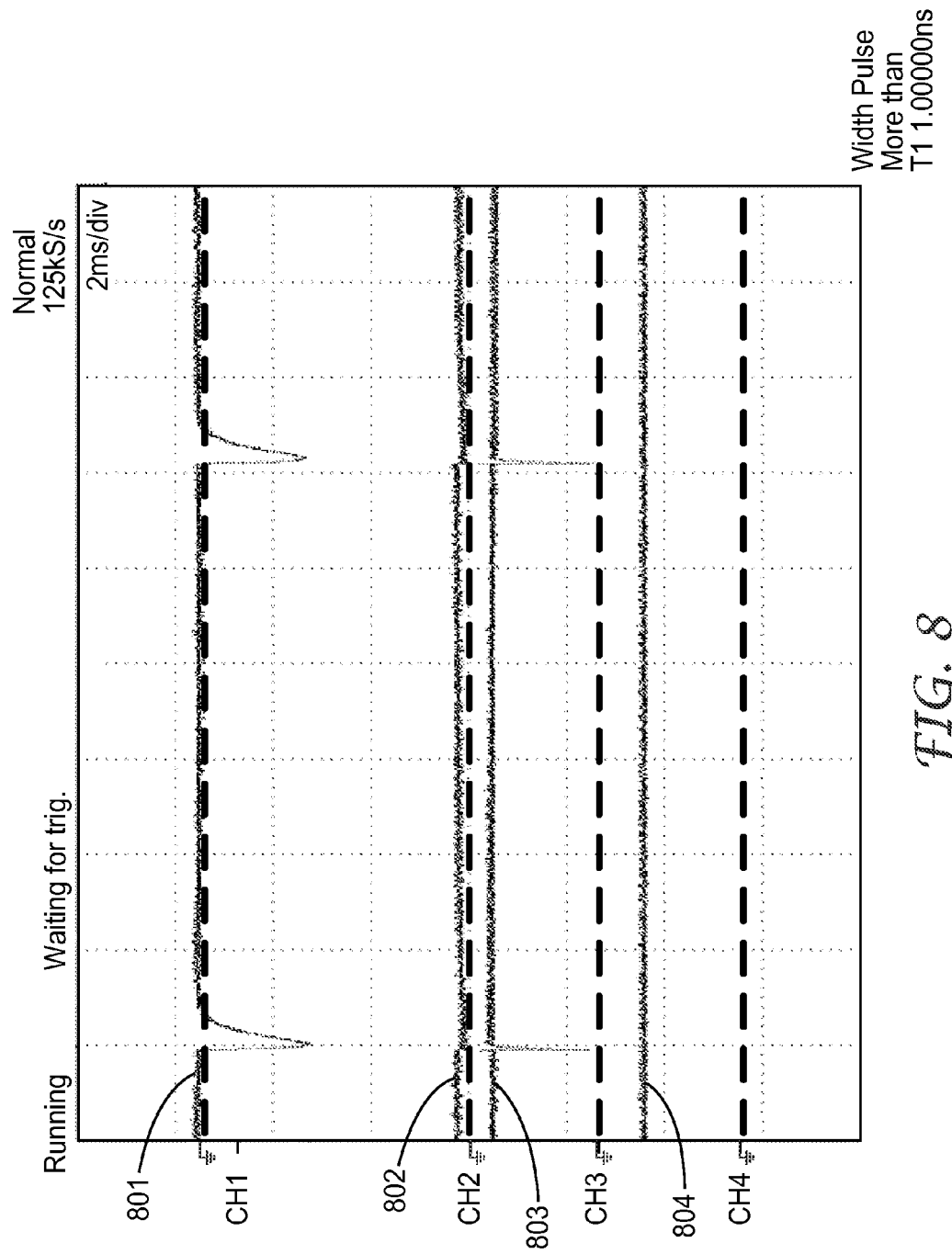
FIGS. 8-13 are graphs illustrating various signals consistent with examples of this disclosure.
Figure 9:
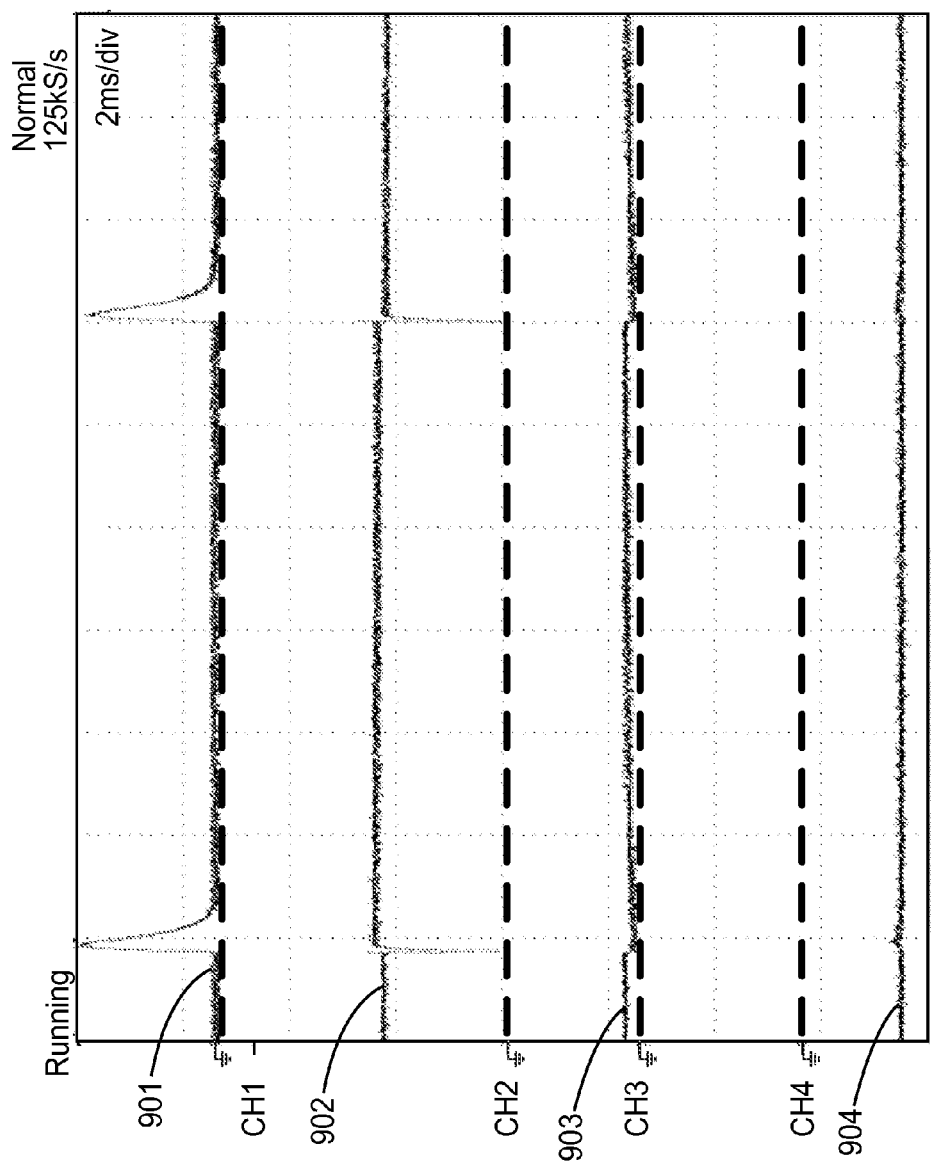

FIGS. 8 and 9 are graphs illustrating two different sequences of pulses generated by an ion measurement circuit 20 such as illustrated in FIGS. 2, 3 and 6. In these examples, no feedback or adjustments are delivered to the ion source that emits ions to charge capacitor 22. FIG. 8 illustrates pulses 801 generated in a case of positive ion imbalance and FIG. 9 illustrates pluses 901 generated in a case of negative ion imbalance. These pulses 801 or 901 may be used (and possibly signal conditioned) to produce control signals for that can adjust the output of the ion source (e.g., adjust the relative outputs of positive ion unit 14 and negative ion unit 15 in FIG. 1). In FIGS. 8 and 9, pulses 801 and 901 do not change because feedback is not used, in these examples, to change the output of the ion source.

Figure 14:
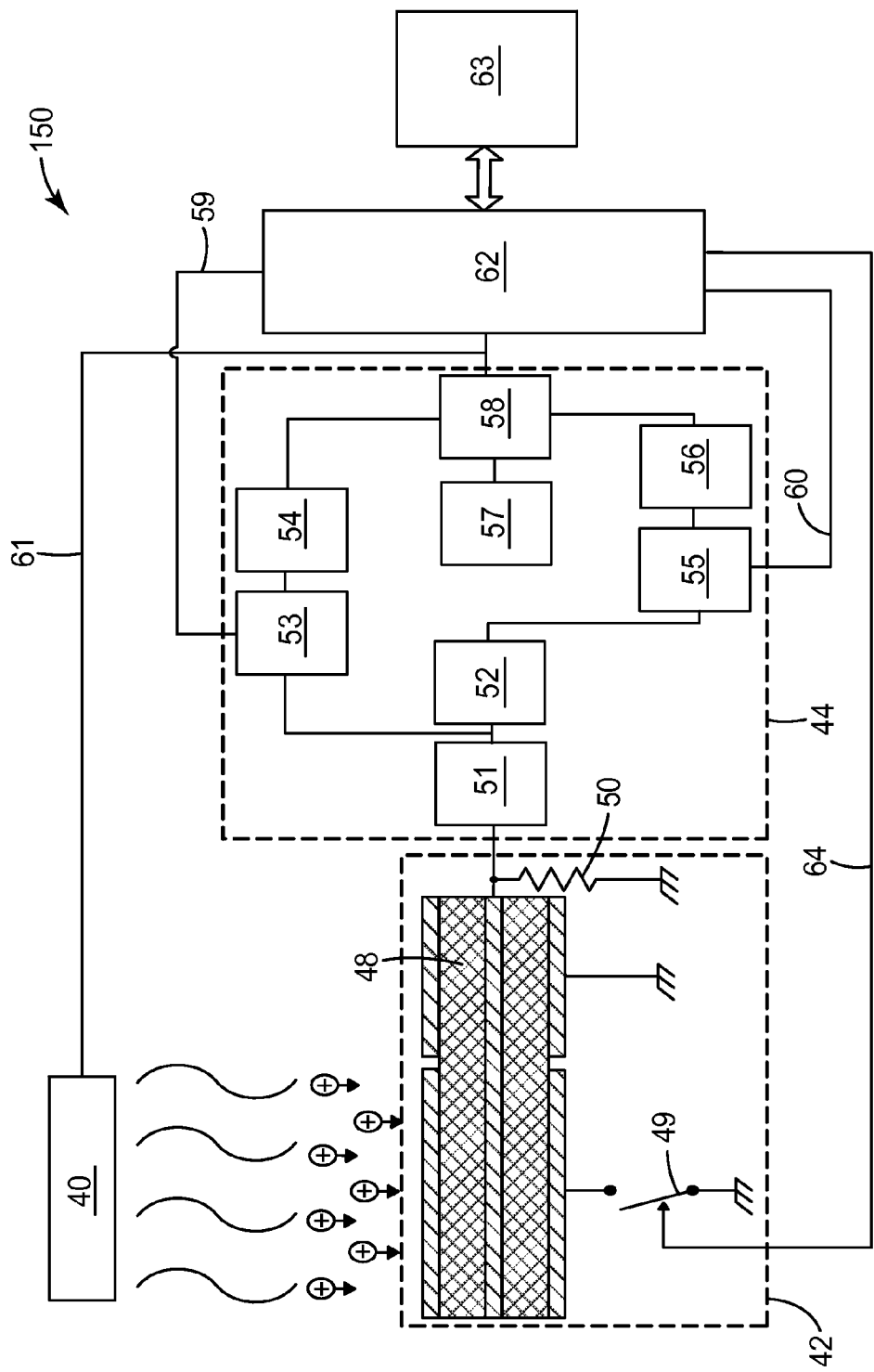
FIG. 14 is a block diagram of an exemplary ionization balancing device consistent with this disclosure.

FIG. 14 is a block diagram illustrating one example of an ionization balance device 100. Ionization balance device 150 may be one example of ionization balance 10 of FIG. 1. In FIG. 14, ion source 40 may correspond to ion source 12 of FIG. 1. In FIG. 14, element 44 may represent one example of signal conditioning unit 17 of FIG. 1. In FIG. 14, unit 62 may represent control unit 18 of FIG. 1. Unit 63 may comprise an interface unit, such as a display or an interface to a network.

In the example of FIG. 14, unit 42 comprises a capacitor sensor unit, and structure 48 comprises first and second capacitors as described herein. The first and second capacitors may share a conductor that is shielded from the ions emitted by ion source 40. The first capacitor may have a conductor that is exposed to the ions emitted by ion source 40. Both conductors of the second capacitor may be shielded from ions. The shared conductor of the two capacitors may be loaded to resistor 50, which is then coupled to ground. The conductor of the first capacitor, which is exposed to the ions emitted by ion source 40, may be coupled to ground via electronic switch 49. The line 64 from the controller 62 may be used to periodically turn switch 49 on and off, and as a result, a sequence of pulses are generated across resistor 50.

A unit gain non-invert amplifier 51 may be used for matching the output sensor impedance. From the output of the unit gain non-invert amplifier 51, the sequence of pulses may pass to the input of a first peak and hold voltage detector 53. This first peak and hold voltage detector 53 may be configured to operate on positive pulses, e.g., when the ionizer imbalance is negative. Also, the output of unit gain non-invert amplifier 51 may also pass through a second unit gain inverting amplifier 52 to the input of the second peak and hold voltage detector 55. This second peak and hold voltage detector 55 may operate on negative pulses, e.g., when the ionizer imbalance is positive. The controller 62 may comprise a microcontroller (or other type of processor) and may periodically reset both peak and hold voltage detectors 53 and 55 via signals 59 and 60 respectively.

Referring back to FIGS. 8 and 9, the timing associated with outputs of peak and hold detectors 53 and 55 for positive imbalance may be shown as elements 802 and 803 respectively. Analogously, similar timing associated with outputs of peak and hold detectors 53 and 55 for negative imbalance may be shown as element 902 (for peak and hold detector 53) and as 903 (for peak and hold detector 55).

Controller 62 may reset both peak and hold detectors 53 and 54 to zero before discharging the capacitors of unit 42. This is why short negative spikes on the output of the peak and hold detectors 53 and 55 may be present. Such spikes, however, can be eliminated by two low pass filters 54 and 56 for peak and hold detectors 53 and 55, respectively. The outputs of both low pass filters 54 and 56 may be connected to inputs of a differential amplifier 58 in such a way that positive ion imbalance creates a positive voltage that is proportional to the extra positive ions current and a negative imbalance creates a negative voltage that is proportional to a negative ion current. The output 61 of differential amplifier 58 may be represented as elements 804 of FIG. 8 or element 904 of FIG. 9. The voltage associated with output 61 may be used for ionizer balance adjustment in a negative feedback loop system. An additional block 57 may be used for initial system balancing. The output 61 may generally comprise a control signal, and may be passed though analog to digital converter (not shown) to create input to controller 62. Block 63 may generally represent an interface or display for expressing the circuit state, or a block that can network the device to another unit or device. The dotted lines shown in FIGS. 8 and 9 may represent zero voltage levels for various oscilloscope channels.

Figure 10:
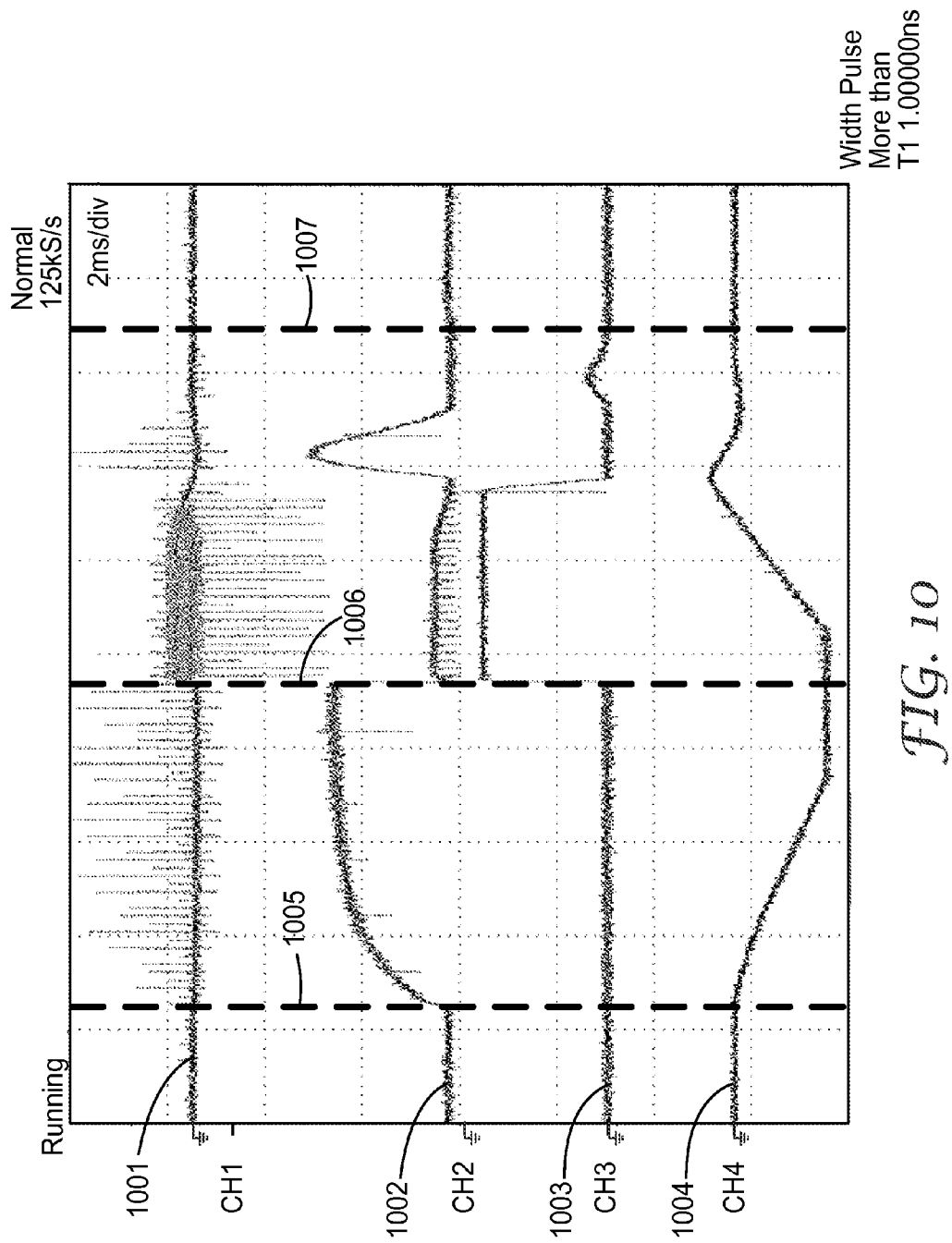

FIG. 10 is a graph illustrating exemplary timing possibilities in ionization control. Graph element 1001 may represent the output of structure 42 of FIG. 14 (structure 42 is also referred to as a capacitor sensor unit). Graph elements 1002 and 1003 may be outputs of first peak and hold detector 53 for the negative imbalance, and second peak and hold detector 55 for the positive imbalance, respectively. Graph element 1004 may correspond to control signal 61 in the case of negative imbalance.

FIG. 10 represents actual oscillograms associated with an exemplary ionizing blower with the maximum possible negative initial imbalance preset by a balance adjustment resistor. The dotted line 1005 indicates the moment of time t1 when the output control signal 61 was disconnected from input to ion source 40. The dotted line 1006 is assigned to the time moment t2 when the feedback loop is restored and control signal 61 was reconnected to the input to ion source 40. The dotted line 1007 represents a time moment t3 when ion balance was achieved. As could be seen at the moment t1, when the control signal is disconnected, the ionization balance device begins to produce extra negative ions and positive pulses begin to sequence on the output of the capacitor sensor unit 42 (such as illustrated by graph element 1001). This causes increases to the output voltage of first peak and hold detector 53 (see graph element 1002) and decrease the output control voltage 61 (graph element 1004). At some point, the output control voltage reaches its maximum negative value (in this example −5.0 V) and may be saturated at this level.

At moment t2, the control signal is reconnected to the input to ion source 40. At this point, a large negative control voltage is delivered by control signal 61 so as to adjust ion source 40 to more positive ions, and this process is generally reflected by the spikes in polarity on capacitor sensor unit 42 from positive to negative. In this case, output voltage of second peak and hold detector 55 may abruptly increase and the output voltage of first peak and hold detector 53 may drop. After this, control signal 61 swings the ion balance again in two or more increments with decreasing amplitude. Finally, at the moment t3 in FIG. 10, the ion balancing device 150 is once again balanced.

Figure 11:
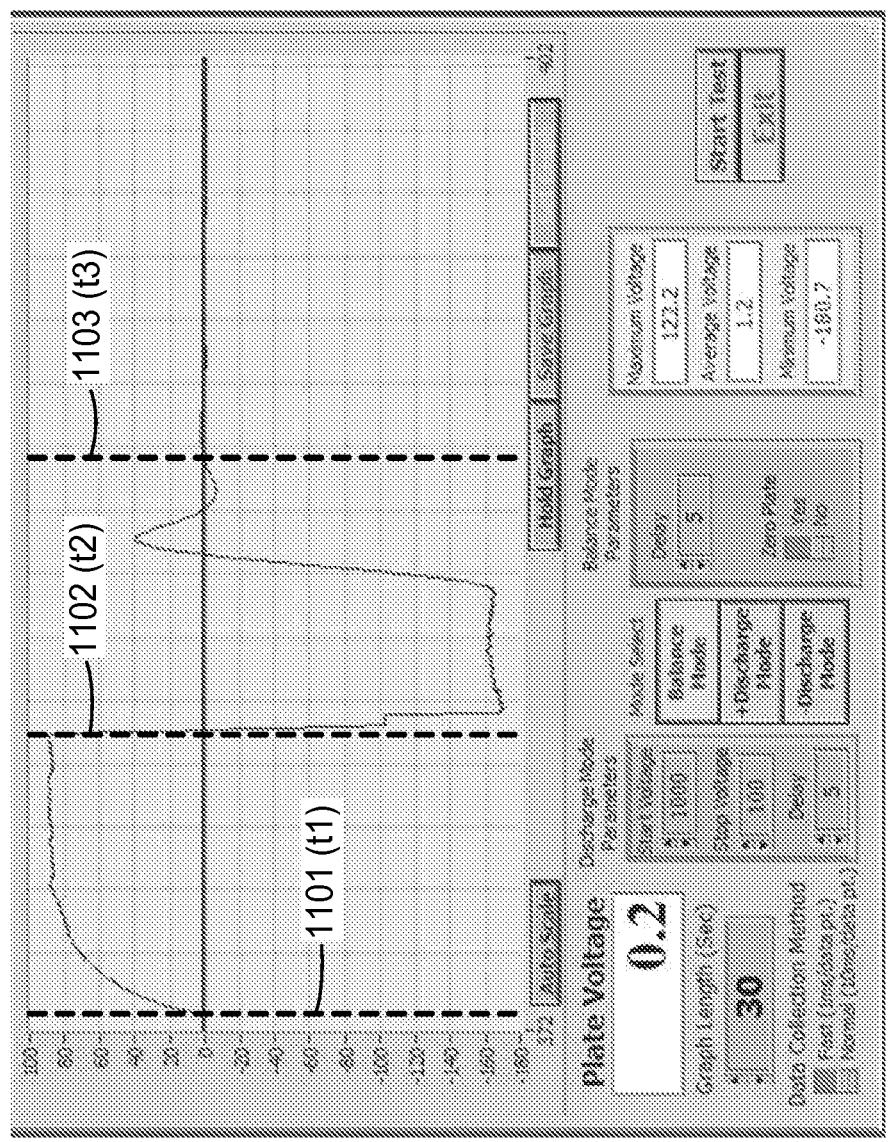

FIG. 11 is another graph illustrating actual dynamic performance of an exemplary ionization balance device as described herein. Initially, the ionization balance device is balanced. At the time moment t1 (shown as the dotted line 1101) a positive imbalance of approximately 90 Volts was generated, and at the time moment t2 (shown as the dotted line 1102) the controller feedback was connected. At the time moment t3 (shown as the dotted line 1103) the ionization balance device was again balanced, which only took approximately 8 seconds.

Figure 12:
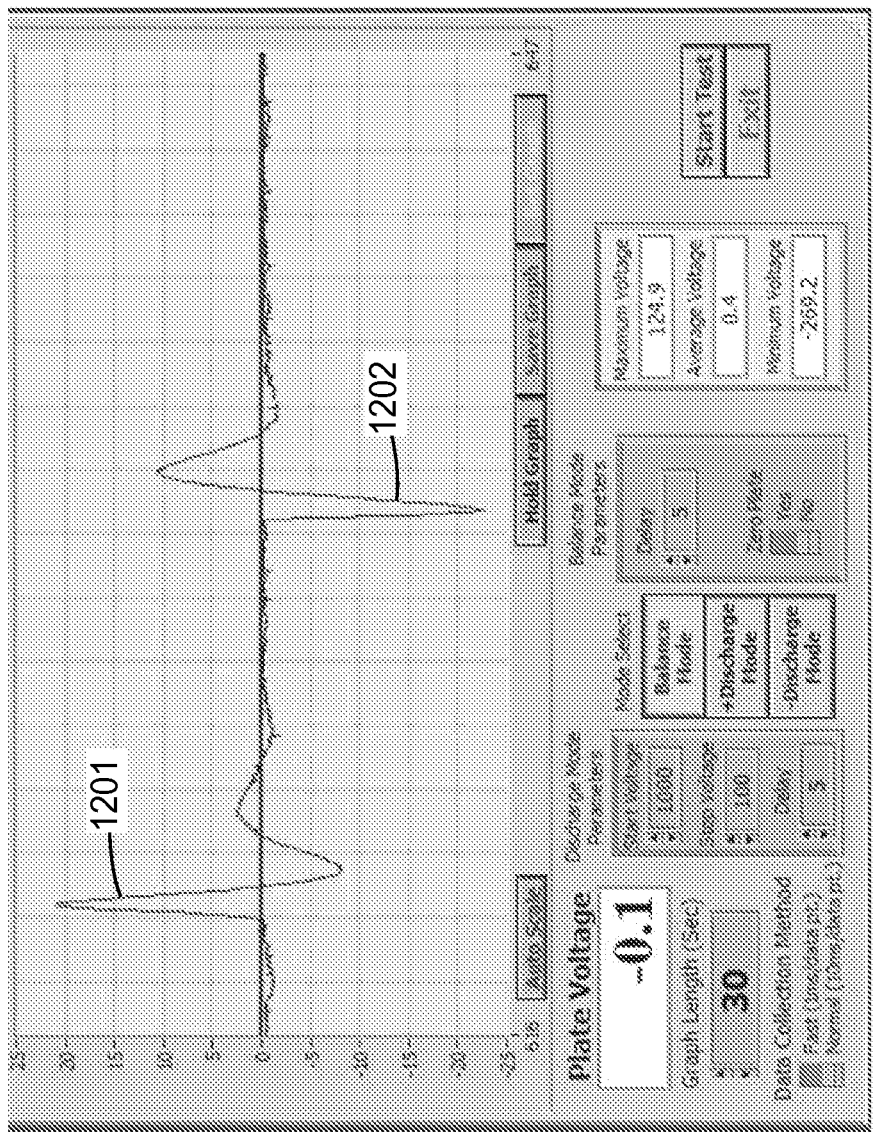
Figure 13:
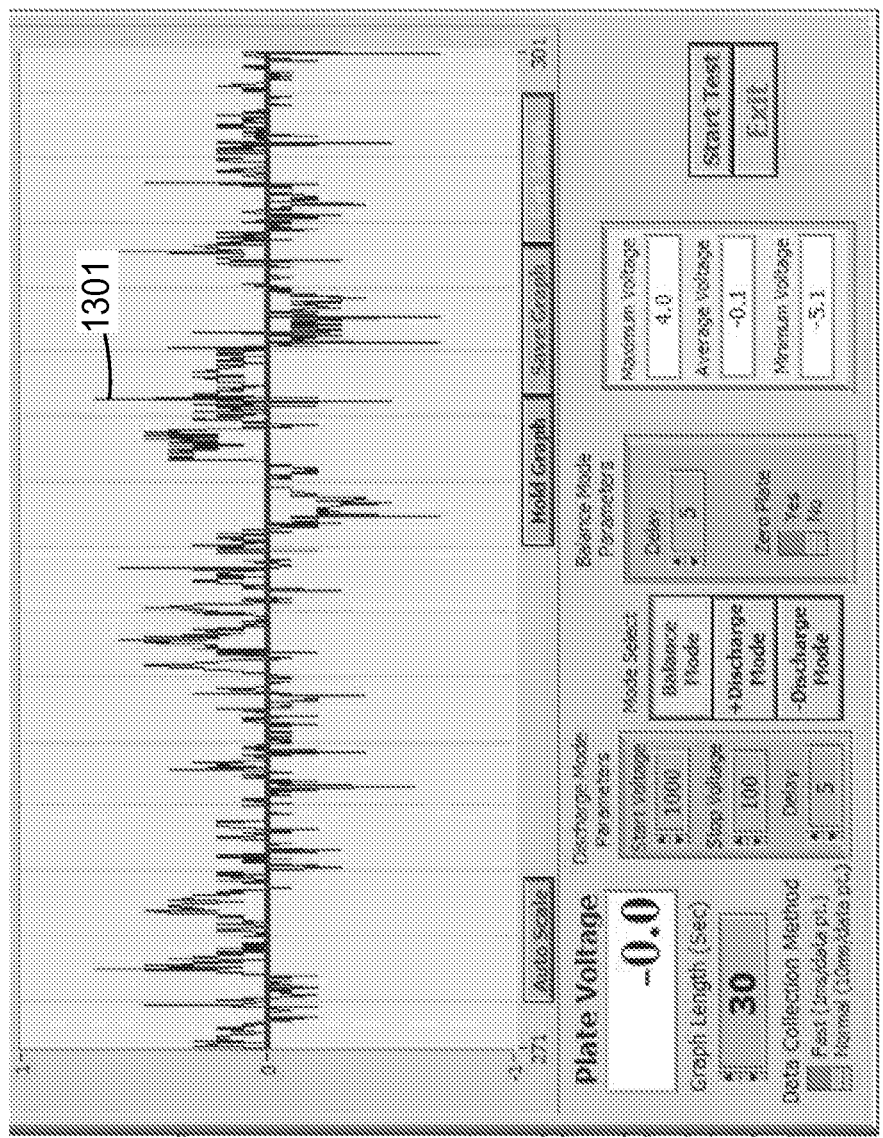

FIG. 12 is another graph representing a situation of positive (element 1201) and negative (element 1202) ionizer imbalance adjustment by a controller consistent with the techniques described herein. As shown in FIG. 12, ionization balance is restored quickly and accurately following each of the positive (element 1201) and negative (element 1202) ionizer imbalance adjustments. FIG. 13 is a graph illustrating measured ion imbalance (as signal 1301) in an ionization balance device using the ion measurement circuit and feedback described herein. As shown in FIG. 13, the circuit and techniques described herein achieved ion balance accuracy to better than ±1 Volt for this particular case.

Figure 15:
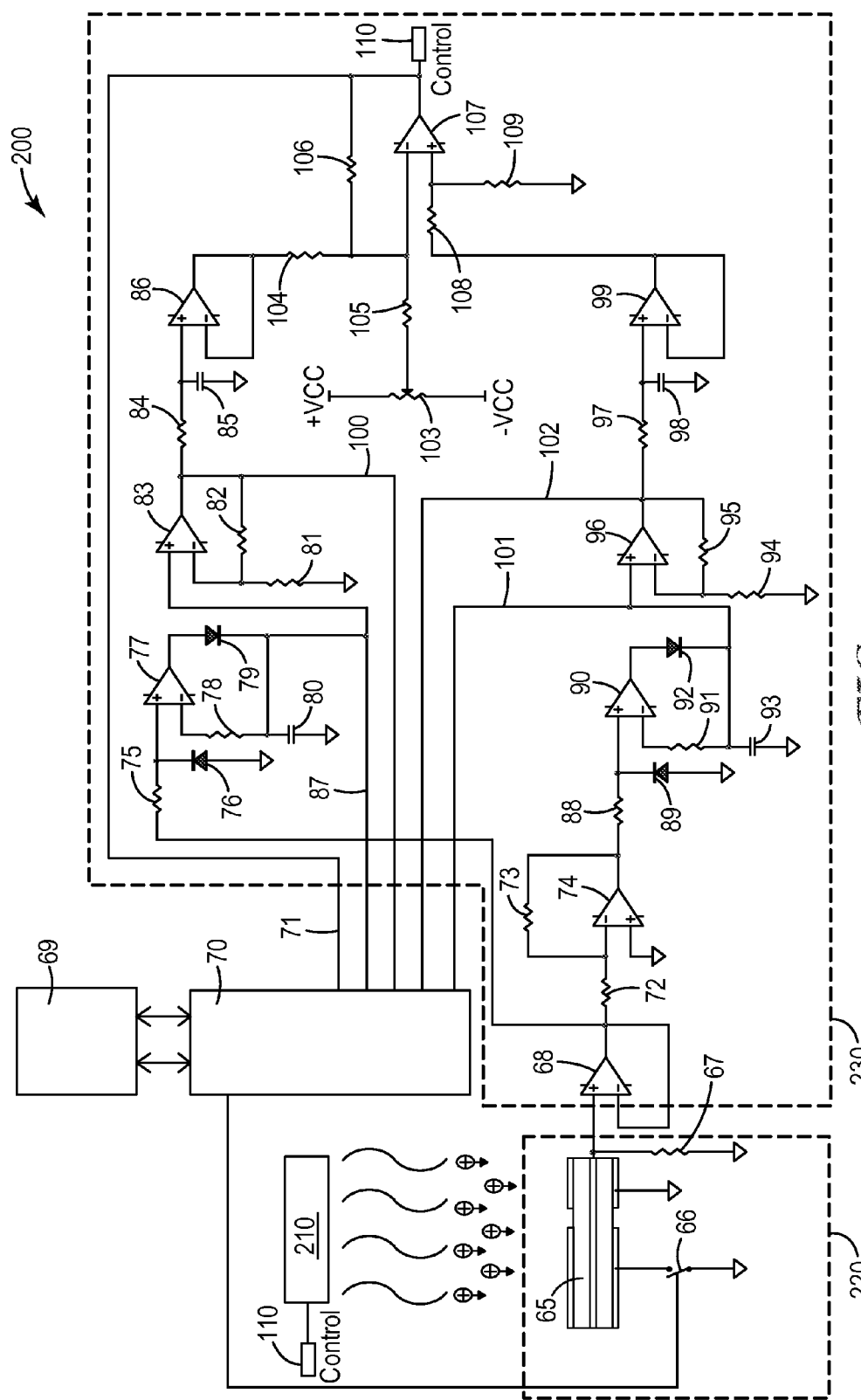
FIG. 15 is a circuit diagram of an exemplary ionization balancing device consistent with this disclosure.

FIG. 15 is yet a schematic diagram illustrating one example of an ionization balance device 200. Ionization balance device 200 may be one example of ionization balance 10 of FIG. 1. In FIG. 15, ion source 210 may correspond to ion source 12 of FIG. 1. In FIG. 15, element 230 may represent one example of signal conditioning unit 17 of FIG. 1. In FIG. 15, unit 70 may represent control unit 18 of FIG. 1. Unit 69 may comprise an interface unit, such as a display or an interface to a network.

Unit 220 comprises a capacitor sensor unit, and structure 65 comprises first and second capacitors as described herein. The first and second capacitors may share a conductor that is shielded from the ions emitted by ion source 210. The first capacitor within structure 65 may have a conductor that is exposed to the ions emitted by ion source 210. Both conductors of the second capacitor within structure 65 may be shielded from ions. The shared conductor of the two capacitors within structure 65 may be loaded to resistor 67, which is then coupled to ground. The conductor of the first capacitor, which is exposed to the ions emitted by ion source 210, may be coupled to ground via electronic switch 66. The signal from the controller 70 may be used to periodically turn switch 66 on and off, and as a result, a sequence of pulses are generated across resistor 67.

Again, structure 65 is connected through the electronic switch 66 to the ground and loaded to resistor 67. The voltage from the resistor 67 passes through the unit gain non-inverting amplifier 68 to the first peak and hold detector realized via operational amplifiers 77 and 83, resistors 78, 81 and 82, diode 79 and capacitor 80. Negative pulses are passed through a diode limiter implemented via resistor 75 and diode 76, which rejects the negative polarity pulses when the ionizer imbalance is positive. The output signal from unit gain amplifier 68 also passes through the unit gain inverting amplifier realized via operational amplifier 74, resistors 72 and 73. Second negative pulses pass diode limiter on the base of the resistor 88 and diode 89 to the second peak and hold detector. This second peak and hold detector may be implemented via operational amplifiers 90 and 96, resistors 91, 94 and 95, diode 92 and capacitor 93.

The first peak and hold detector generates an output voltage proportional to negative ion imbalance and keeps output at zero when the imbalance is positive. The second peak and hold detector output voltage that is proportional to positive imbalance and equal to zero when the imbalance is negative. Both peak and hold detectors outputs are connected through first order low pass filters to a differential amplifier. The first order low pass filters may be implemented via resistor 84, capacitor 85, operational amplifier 86; and via resistor 97, capacitor 98 and operational amplifier 99. The differential amplifier may be realized on the base of operational amplifier 107, resistors 104, 106, 108 and 109. A connection may be provided in such a way that the sign of the differential amplifier output voltage is the same as the sign of ion imbalance. The circuit may also include variable resistor 103, connected to the positive and negative power supplies, and resistor 105 may be added to the circuitry for an initial zero balancing, e.g., to compensate any offset voltages and parts parameters accuracy. The output of the differential amplifier 110 may comprise a control signal used for adjustment of ion source 210.

Additionally, the outputs of both peak and hold detectors may be connected to an analog to digital converters (not shown) so as to generate inputs to controller 70 (shown as signal lines 100, 102 and 71) for ion imbalance and control signal state indication, or for transfer of this information to another device or display via network interface 69. Additionally controller 70 may deliver two signals 100 and 102 to control reset of the peak and hold detectors. Controller 70 may also manipulate control switch 66, e.g., turning it on and off as described herein.

Figure 16:
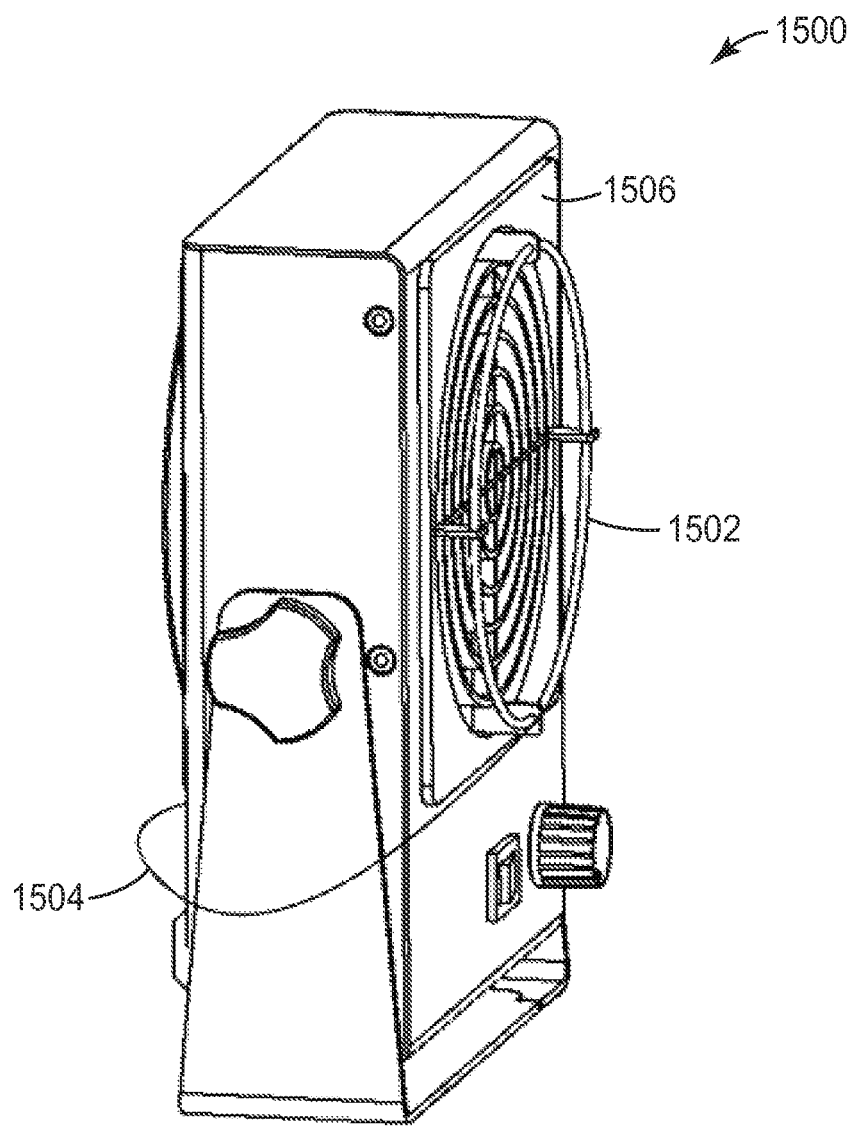
FIG. 16 is a perspective view of one exemplary ionization balancing device that may implement the circuits and techniques of this disclosure.

FIG. 16 is one illustrative example of an ionization balance device 1500 consistent with this disclosure. In this example, the described capacitor sensing unit may be implemented as a ring 1502 connected via a cable 1503 to a controller board, which located inside housing 1506. Ring 1502 may be positioned symmetrically to various ionizer needles located inside housing 1506 and may have a common axis with a fan inside housing 1006. In still other examples, ring 1502 (or another type of capacitor structure with a shielded conductor) could be housed inside of hosing 1506. Also, the described circuit could be used with other types of ionization balance device, such as ionization balance devices that do not use a fan, or a measurement circuit for multiple ionization devices that deliver ion balanced air to a larger area, such as a clean room.

Following are exemplary embodiments of an ionization balance device with shielded capacitor circuit for ion balance measurements and adjustments according to aspects of the present invention.

Embodiment 1 is an ionization balance device comprising: an ion source that emits ions; and a capacitor including a first conductor and a second conductor, wherein: the first conductor is exposed to the ions emitted by the ion source; and the second conductor is shielded from the ions emitted by the ion source.

Embodiment 2 is the ionization balance device of embodiment 1, wherein the first conductor shields the second conductor from the emitted ions.

Embodiment 3 is the ionization balance device of embodiment 1, wherein the capacitor comprises: an outer conductor comprising the first conductor; and an inner conductor comprising the second conductor.

Embodiment 4 is the ionization balance device of embodiment 3, wherein the capacitor comprises a dielectric between the outer conductor and the inner conductor.

Embodiment 5 is the ionization balance device of embodiment 3, wherein the capacitor comprises one of: a cylindrical capacitor, a rectangular capacitor, and an oval capacitor.

Embodiment 6 is the ionization balance device of embodiment 1, further comprising a signal conditioning circuit coupled to the capacitor, wherein the signal conditioning circuit is configured to output a signal indicative of ion balance.

Embodiment 7 is the ionization balance device of embodiment 6, wherein the signal conditioning circuit is configured to generate: a first signal proportional to a positive charge on the capacitor; and a second signal proportional to a negative charge on the capacitor.

Embodiment 8 is the ionization balance device of embodiment 6, wherein the signal conditioning circuit comprises at least one of an amplifier, a peak and hold unit, and a low pass filter.

Embodiment 9 is the ionization balance device of embodiment 7, wherein the signal conditioning circuit is configured to generate a difference between the first signal and the second signal, wherein the difference comprises a measure of ion balance.

Embodiment 10 is the ionization balance device of embodiment 9, further comprising a control unit that receives the measure of ion balance and generates control signals for the ion source in order to change the ion balance.

Embodiment 11 is the ionization balance device of embodiment 1, further comprising a switch, wherein the first conductor accumulates the emitted ions when the switch is open and the capacitor discharges accumulated charge when the switch is closed.

Embodiment 12 is the ionization balance device of embodiment 11, wherein the switch is opened and closed at periodic intervals to generate signals indicative of ion balance.

Embodiment 13 is the ionization balance device of embodiment 11, wherein the capacitor outputs a pulse when the switch is closed, wherein the pulse defines: a magnitude that is proportional to excess charge accumulated on the first conductor; and a direction that defines whether the excess charge is positive charge or negative charge.

Embodiment 14 is the ionization balance device of embodiment 11, further comprising a resistor sharing an end terminal with the capacitor, wherein the capacitor discharges through the resistor when the switch is closed.

Embodiment 15 is the ionization balance device of embodiment 14, wherein the resistor defines a resistance less than approximately 10 megaOhm.

Embodiment 16 is the ionization balance device of embodiment 14, wherein the capacitor comprises a first capacitor, the ionization balance device further comprising a second capacitor positioned in parallel with the resistor, the parallel combination of the resistor and the second capacitor being in series with the first capacitor.

Embodiment 17 is the ionization balance device of embodiment 16, wherein the second capacitor comprises the second conductor of the first capacitor and a third conductor.

Embodiment 18 is the ionization balance device of embodiment 17, wherein the second conductor and the third conductor are shielded from the emitted ions.

Embodiment 19 is a circuit configured to measure ion balance of an ion source, the circuit comprising: a first capacitor including a first conductor and a second conductor, wherein the first conductor is exposed to ions emitted by the ion source, and the second conductor is shielded from the ions emitted by the ion source; a second capacitor comprising the second conductor of the first capacitor and a third conductor; a resistor positioned in parallel with the second capacitor, the parallel combination of the resistor and the second capacitor being in series with the first capacitor; and a switch, wherein the first conductor accumulates emitted ions from the ion source when the switch is open and the first capacitor discharges accumulated charge when the switch is closed.

Embodiment 20 is the circuit of embodiment 19, wherein the first conductor shields the second conductor from the emitted ions.

Embodiment 21 is the circuit of embodiment 19, wherein the first capacitor comprises: an outer conductor comprising the first conductor; and an inner conductor comprising the second conductor.

Embodiment 22 is the circuit of embodiment 21, wherein the first capacitor comprises a dielectric between the outer conductor and the inner conductor.

Embodiment 23 is the circuit of embodiment 21, wherein the first capacitor comprises one of: a cylindrical capacitor, a rectangular capacitor, and an oval capacitor.

Embodiment 24 is the circuit of embodiment 19, further comprising a signal conditioning unit, wherein the signal conditioning circuit is configured to output a signal indicative of ion balance based on the accumulated charge discharged by the first capacitor.

Embodiment 25 is the circuit of embodiment 24, wherein the signal conditioning unit is configured to generate: a first signal proportional to a positive charge on the first capacitor; and a second signal proportional to a negative charge on the first capacitor.

Embodiment 26 is the circuit of embodiment 24, wherein the signal conditioning unit comprises at least one of an amplifier, a peak and hold unit, and a low pass filter.

Embodiment 27 is the circuit of embodiment 25, wherein the signal conditioning unit is configured to generate a difference between the first signal and the second signal, wherein the difference comprises a measure of ion balance.

Embodiment 28 is the circuit of embodiment 25, further comprising a control unit that receives the measure of ion balance and generates control signals to the ion source to change the ion balance.

Embodiment 29 is the circuit of embodiment 21, wherein the switch is opened and closed in periodic intervals to generate signals indicative of ion balance.

Embodiment 30 is the circuit of embodiment 21, wherein the circuit outputs a pulse when the switch is closed, wherein the pulse defines: a magnitude that is proportional to excess charge accumulated on the first conductor; and a direction that defines whether the excess charge is positive charge or negative charge.

Embodiment 31 is the circuit of embodiment 21, wherein the resistor defines a resistance less than approximately 10 megaOhm.

Embodiment 32 is the circuit of embodiment 21, wherein the second conductor and the third conductor are shielded from the emitted ions.

Embodiment 33 is a circuit configured to measure ion balance of an ion source, the circuit comprising: a first capacitor including a first conductor and a second conductor; a second capacitor comprising the second conductor of the first capacitor and a third conductor; and a resistor positioned in parallel with the second capacitor, the parallel combination of the resistor and the second capacitor being in series with the first capacitor, wherein the resistor defines a resistance less than approximately 10 megaOhm.

Embodiment 34 is the circuit of embodiment 33, wherein the resistance is between 100 kiloOhm and 10 megaOhm.

Embodiment 35 is the circuit of embodiment 33, further comprising a switch, wherein the first conductor accumulates emitted ions from the ion source when the switch is open and the capacitor discharges accumulated charge when the switch is closed.

Embodiment 36 is the circuit of embodiment 33, wherein the first conductor is exposed to emitted ions from the ion source and the second conductor is shielded from the emitted ions.

Embodiment 37 is a device comprising: an ion source that emits ions; and a circuit configured to receive the emitted ions from the ion source and output a signal indicative of ion balance of the ion source, wherein the signal is substantially insensitive to any external electromagnetic fields that are not generated by the emitted ions.

Embodiment 38 is the device of embodiment 37, wherein the circuit comprises a first capacitor including a first conductor and a second conductor, wherein the first conductor is exposed to ions emitted by the ion source, and the second conductor is shielded from the ions emitted by the ion source; a second capacitor comprising the second conductor of the first capacitor and a third conductor; a resistor positioned in parallel with the second capacitor, the parallel combination of the resistor and the second capacitor being in series with the first capacitor; and a switch, wherein the first conductor accumulates emitted ions from the ion source when the switch is open and the first capacitor discharges accumulated charge when the switch is closed.

A number of examples and embodiments have been described. In particular, circuits and techniques have been described, which may be used to measure the ion balance in an ionization balance device. The described circuit may be configured to receive the emitted ions from an ion source and output a signal indicative of ion balance of the ion source, wherein the signal is substantially insensitive to any external electromagnetic fields that are not generated by the emitted ions. For example, the signal that is substantially insensitive to any external electromagnetic fields may be affected by external fields to less than approximately one volt, and the ion balance may be achieved to less than approximately one volt of positive or negative variation.

These and other examples and embodiments are within the scope of the following claims.

The invention claimed is:

1. An ionization balance device for use with a stream of ions flowing away from the ionization balance device and in a direction generally toward a target area, wherein the stream of ions is comprised of a plurality of ions, the ionization balance device comprising:
an ion source configured to emit the plurality of ions;
a capacitor including a first conductor and a second conductor,
wherein the first conductor is configured to be exposed to at least a portion of the plurality of ions; and
wherein the second conductor is configured to be shielded from the at least a portion of the plurality of ions and to output a first signal; and
a signal conditioning circuit coupled to the second conductor of the capacitor, wherein the signal conditioning circuit is configured to receive the first signal and to output a second signal indicative of ion balance based, at least in part, upon the first signal, and wherein the signal conditioning circuit includes at least one peak and hold detector.

2. The ionization balance device of claim 1, wherein the first conductor is further configured to shield the second conductor from the at least a portion of the plurality of ions.

3. The ionization balance device of claim 1, wherein the capacitor comprises:
an outer conductor comprising the first conductor; and
an inner conductor comprising the second conductor.

4. The ionization balance device of claim 3, wherein the capacitor comprises a dielectric between the outer conductor and the inner conductor.

5. The ionization balance device of claim 3, wherein the capacitor comprises one of:
a cylindrical capacitor,
a rectangular capacitor, and
an oval capacitor.

6. The ionization balance device of claim 1, wherein the signal conditioning circuit is configured to generate:
a third signal proportional to a positive charge on the capacitor; and
a fourth signal proportional to a negative charge on the capacitor.

7. The ionization balance device of claim 1, wherein the signal conditioning circuit further comprises at least one of:
an amplifier, and
a low pass filter.

8. The ionization balance device of claim 6, wherein the second signal of the signal conditioning circuit is based, at least in part, upon a difference between the third signal and the fourth signal.

9. The ionization balance device of claim 8, further comprising a control unit configured to receive the second signal of the signal conditioning circuit and generate control signals for the ion source in order to change the ion balance.

10. The ionization balance device of claim 1, further comprising a switch, wherein the first conductor is configured to accumulate the at least a portion of the plurality of ions when the switch is open, and wherein the capacitor is configured to discharge accumulated charge when the switch is closed.

11. The ionization balance device of claim 10, wherein the switch is configured to be opened and closed at periodic intervals to generate signals indicative of ion balance.

12. The ionization balance device of claim 10, wherein the capacitor is configured to output a pulse when the switch is closed, wherein the pulse defines:
a magnitude that is proportional to an excess charge accumulated on the first conductor; and
a direction that defines whether the excess charge is a positive charge or a negative charge.

13. The ionization balance device of claim 10, further comprising a resistor sharing an end terminal with the capacitor, wherein the capacitor is configured to discharge through the resistor when the switch is closed.

14. The ionization balance device of claim 13, wherein the resistor defines a resistance less than approximately 10 megaOhm.

15. The ionization balance device of claim 13, wherein the capacitor is a first capacitor, the ionization balance device further comprising a second capacitor positioned in parallel with the resistor, the parallel combination of the resistor and the second capacitor being in series with the first capacitor.

16. The ionization balance device of claim 15, wherein the second capacitor comprises the second conductor of the first capacitor and a third conductor.

17. The ionization balance device of claim 16, wherein the third conductor is configured to be shielded from the at least a portion of the plurality of ions.

18. The ionization balance device of claim 1,
wherein the second signal is substantially insensitive to any external electromagnetic fields that are not generated by the plurality of ions.

19. The ionization balance device of claim 18, wherein the capacitor is a first capacitor, the ionization balance device further comprising:
a second capacitor comprising the second conductor of the first capacitor and a third conductor;
a resistor positioned in parallel with the second capacitor, the parallel combination of the resistor and the second capacitor being in series with the first capacitor; and
a switch, wherein the first conductor is configured to accumulate the at least a portion of the plurality of ions when the switch is open, and wherein the first capacitor is configured to discharge accumulated charge when the switch is closed.

20. A circuit configured to measure ion balance of an ion source, wherein the circuit is for use with a stream of ions flowing away from the ion source and in a direction generally toward a target area, wherein the stream of ions is comprised of a plurality of ions, the circuit comprising:
a first capacitor including a first conductor and a second conductor,
wherein the first conductor is configured to be exposed to at least a portion of the plurality of ions, and
wherein the second conductor is configured to be shielded from the at least a portion of the plurality of ions and to output a first signal;
a second capacitor comprising the second conductor of the first capacitor and a third conductor;
a resistor positioned in parallel with the second capacitor, the parallel combination of the resistor and the second capacitor being in series with the first capacitor;
a switch, wherein the first conductor is configured to accumulate the at least a portion of the plurality of ions when the switch is open, and wherein the first capacitor is configured to discharge accumulated charge when the switch is closed; and
a signal conditioning circuit coupled to the second conductor of the first capacitor, wherein the signal conditioning circuit is configured to receive the first signal and to output a second signal indicative of ion balance based, at least in part, upon the first signal, and wherein the first signal is based on the accumulated charge discharged by the first capacitor, and wherein the signal conditioning circuit includes at least one peak and hold detector.

21. The circuit of claim 20, wherein the first conductor is configured to shield the second conductor from the at least a portion of the plurality of ions.

22. The circuit of claim 20, wherein the first capacitor comprises:
an outer conductor comprising the first conductor; and
an inner conductor comprising the second conductor.

23. The circuit of claim 22, wherein the first capacitor comprises a dielectric between the outer conductor and the inner conductor.

24. The circuit of claim 22, wherein the first capacitor comprises one of:
a cylindrical capacitor,
a rectangular capacitor, and
an oval capacitor.

25. The circuit of claim 20, wherein the signal conditioning circuit is configured to generate:
a third signal proportional to a positive charge on the first capacitor; and
a fourth signal proportional to a negative charge on the first capacitor.

26. The circuit of claim 20, wherein the signal conditioning unit comprises at least one of:
an amplifier, and
a low pass filter.

27. The circuit of claim 25, wherein the second signal of the signal conditioning unit is based, at least in part, upon a difference between the third signal and the fourth signal.

28. The circuit of claim 27, further comprising a control unit configured to receive the second signal of the signal conditioning circuit and generate control signals to the ion source to change the ion balance.

29. The circuit of claim 22, wherein the switch is configured to be opened and closed at periodic intervals to generate signals indicative of ion balance.

30. The circuit of claim 22, wherein the circuit is configured to output a pulse when the switch is closed, wherein the pulse defines:
a magnitude that is proportional to an excess charge accumulated on the first conductor; and
a direction that defines whether the excess charge is a positive charge or a negative charge.

31. The circuit of claim 22, wherein the resistor defines a resistance less than approximately 10 megaOhm.

32. The circuit of claim 22, wherein the third conductor is configured to be shielded from the at least a portion of the plurality of ions.

33. A circuit configured to measure ion balance of an ion source, wherein the circuit is for use with a stream of ions flowing away from the ion source and in a direction generally toward a target area, wherein the stream of ions is comprised of a plurality of ions, the circuit comprising:
a first capacitor including a first conductor and a second conductor,
wherein the first conductor is configured to be exposed to at least a portion of the plurality of ions, and
wherein the second conductor is configured to be shielded from the at least a portion of the plurality of ions and to output a first signal;
a second capacitor comprising the second conductor of the first capacitor and a third conductor;
a resistor positioned in parallel with the second capacitor, the parallel combination of the resistor and the second capacitor being in series with the first capacitor, wherein the resistor defines a resistance less than approximately 10 megaOhm; and
a signal conditioning circuit coupled to the second conductor of the first capacitor, wherein the signal conditioning circuit is configured to receive the first signal and to output a second signal indicative of ion balance based, at least in part, upon the first signal, and wherein the signal conditioning circuit includes at least one peak and hold detector.

34. The circuit of claim 33, wherein the resistance is between 100 kiloOhm and 10 megaOhm.

35. The circuit of claim 33, further comprising a switch, wherein the first conductor is configured to accumulate the at least a portion of the plurality of ions when the switch is open, and wherein the capacitor is configured to discharge accumulated charge when the switch is closed.

* * * * *